US008906803B2

(12) United States Patent
Okandan et al.

(10) Patent No.: US 8,906,803 B2
(45) Date of Patent: Dec. 9, 2014

(54) METHOD OF FORMING THROUGH SUBSTRATE VIAS (TSVS) AND SINGULATING AND RELEASING DIE HAVING THE TSVS FROM A MECHANICAL SUPPORT SUBSTRATE

(71) Applicant: Sandia Corporation, Albuquerque, NM (US)

(72) Inventors: Murat Okandan, Edgewood, NM (US); Gregory N. Nielson, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 0 days.

(21) Appl. No.: 14/063,152

(22) Filed: Oct. 25, 2013

(65) Prior Publication Data

US 2014/0264770 A1 Sep. 18, 2014

Related U.S. Application Data

(60) Provisional application No. 61/788,937, filed on Mar. 15, 2013.

(51) Int. Cl.
*H01L 21/44* (2006.01)
*H01L 21/768* (2006.01)
*H01L 21/78* (2006.01)
*H01L 23/48* (2006.01)

(52) U.S. Cl.
CPC .......... *H01L 21/76877* (2013.01); *H01L 21/78* (2013.01); *H01L 23/481* (2013.01); *H01L 2924/0002* (2013.01)
USPC .................... 438/667; 438/113; 257/E21.585

(58) Field of Classification Search
CPC ..................... H01L 21/76877; H01L 21/7806; H01L 21/7813; H01L 23/481; H01L 23/49827
USPC .................... 257/E23.011, E23.067, E23.174, 257/E21.585, E21.586; 438/113, 667
See application file for complete search history.

(56) References Cited

U.S. PATENT DOCUMENTS

| 5,468,652 | A | 11/1995 | Gee |
| 5,501,893 | A | 3/1996 | Laermer et al. |
| 5,792,280 | A | 8/1998 | Ruby et al. |
| 5,871,591 | A | 2/1999 | Ruby et al. |
| 5,944,913 | A | 8/1999 | Hou et al. |
| 5,951,786 | A | 9/1999 | Gee et al. |

(Continued)

OTHER PUBLICATIONS

International Search Report and Written Opinion for PCT/US2014/029074, mailed Jul. 25, 2014.

*Primary Examiner* — Tucker Wright
(74) *Attorney, Agent, or Firm* — Martin I. Finston

(57) ABSTRACT

Accessing a workpiece object in semiconductor processing is disclosed. The workpiece object includes a mechanical support substrate, a release layer over the mechanical support substrate, and an integrated circuit substrate coupled over the release layer. The integrated circuit substrate includes a device layer having semiconductor devices. The method also includes etching through-substrate via (TSV) openings through the integrated circuit substrate that have buried ends at or within the release layer including using the release layer as an etch stop. TSVs are formed by introducing one or more conductive materials into the TSV openings. A die singulation trench is etched at least substantially through the integrated circuit substrate around a perimeter of an integrated circuit die. The integrated circuit die is at least substantially released from the mechanical support substrate.

14 Claims, 8 Drawing Sheets

(56) References Cited

U.S. PATENT DOCUMENTS

| | | |
|---|---|---|
| 5,972,732 A | 10/1999 | Gee et al. |
| 6,091,021 A | 7/2000 | Ruby et al. |
| 6,252,287 B1 | 6/2001 | Kurtz et al. |
| 7,923,345 B2 * | 4/2011 | Sonsky et al. ............ 438/411 |
| 7,935,571 B2 | 5/2011 | Ramiah et al. |
| 7,989,319 B2 | 8/2011 | Grivna et al. |
| 8,236,611 B1 | 8/2012 | Anderson et al. |
| 8,313,982 B2 | 11/2012 | Dunne et al. |
| 8,344,503 B2 | 1/2013 | Sanders et al. |
| 8,461,023 B1 | 6/2013 | Swiler et al. |
| 2011/0065240 A1 | 3/2011 | Gao et al. |
| 2011/0089552 A1 | 4/2011 | Park et al. |
| 2012/0094443 A1 | 4/2012 | Pratt et al. |
| 2013/0001799 A1 | 1/2013 | Chang et al. |

\* cited by examiner

METHOD OF FORMING THROUGH SUBSTRATE VIAS (TSVS) AND SINGULATING AND RELEASING DIE HAVING THE TSVS FROM A MECHANICAL SUPPORT SUBSTRATE

RELATED APPLICATIONS

This application claims the benefit of the earlier filing date of U.S. Provisional Patent Application No. 61/788,937, filed Mar. 15, 2013 entitled "THIN HYBRID 3D ASSEMBLY." The aforementioned application is hereby incorporated by reference, in its entirety, for all purposes.

STATEMENT OF GOVERNMENT RIGHTS

This invention was developed under Contract DE-AC04-94AL85000 between Sandia Corporation and the U.S. Department of Energy. The U.S. Government has certain rights in this invention.

FIELD

Embodiments described herein generally relate to semiconductor processing. In particular, embodiments described herein generally relate to forming semiconductor die.

BACKGROUND

Various three-dimensional (3D) integrated circuit packages are known in the arts. Examples include System in Package, Chip Stack Multi-Chip Modules, and the like. Typically the 3D integrated circuit packages include two or more integrated circuit die that are stacked vertically over one another. Such 3D integrated circuit packages may offer various potential advantages, such as the being substantially compact, providing good electrical connectivity between the die, allowing die of different materials and/or functionalities to be connected together, and the like.

Such 3D integrated circuit packages often utilize through-silicon via interconnections. Unlike conventional wire bonding interconnections that are made around the periphery of the stacked die, the through-silicon via interconnections may provide vertical connections through the die. The through-silicon via interconnections may be used to connect the different die to each other and to connect the die to a printed circuit board and/or package connectors. The through-silicon via interconnections potentially offer relatively short interconnection distances and relatively fast data rates.

SUMMARY

In one aspect, a method may include accessing a workpiece object. The workpiece object may include a mechanical support substrate, a release layer over the mechanical support substrate, and an integrated circuit substrate coupled over the release layer. The integrated circuit substrate may include a device layer having semiconductor devices. The method may also include etching through-substrate via (TSV) openings through the integrated circuit substrate that have buried ends at or within the release layer including using the release layer as an etch stop. TSVs may be formed by introducing one or more conductive materials into the TSV openings. A die singulation trench may be etched at least substantially through the integrated circuit substrate around a perimeter of an integrated circuit die. The integrated circuit die may be at least substantially released from the mechanical support substrate.

An apparatus may include a mechanical support substrate, a release layer over the mechanical support substrate, and an integrated circuit substrate coupled over the release layer. The integrated circuit substrate may include a device layer having semiconductor devices. Through-substrate vias (TSVs) extend through the integrated circuit substrate that have buried ends at or within the release layer. A die singulation trench may be defined by etched trench walls extending at least substantially through the integrated circuit substrate around a perimeter of an integrated circuit die.

An apparatus may include an integrated circuit die. The integrated circuit die may include a device layer having semiconductor devices. Through-substrate vias (TSVs) may extend through the integrated circuit die that have terminal ends at or extending from a surface of the integrated circuit die. The terminal ends of the TSVs may be substantially coplanar. The integrated circuit die may have etched sidewalls.

The above summary does not include an exhaustive list of all aspects of embodiments of the invention. It is contemplated that embodiments may include all systems and methods that may be practiced from all suitable combinations of the various aspects summarized above, as well as those disclosed elsewhere herein in the Detailed Description, and particularly pointed out in the claims filed with the application.

BRIEF DESCRIPTION OF THE DRAWINGS

The invention may best be understood by referring to the following description and accompanying drawings that are used to illustrate embodiments of the invention. In the drawings.

DETAILED DESCRIPTION

In the following description, numerous specific details are set forth (e.g., specific types of devices, materials, operations, orders in which operations are performed, and the like). However, it is understood that embodiments of the invention may be practiced without these specific details. In other instances, well-known circuits, structures and techniques have not been shown in detail in order not to obscure the understanding of this description.

Figure 1:
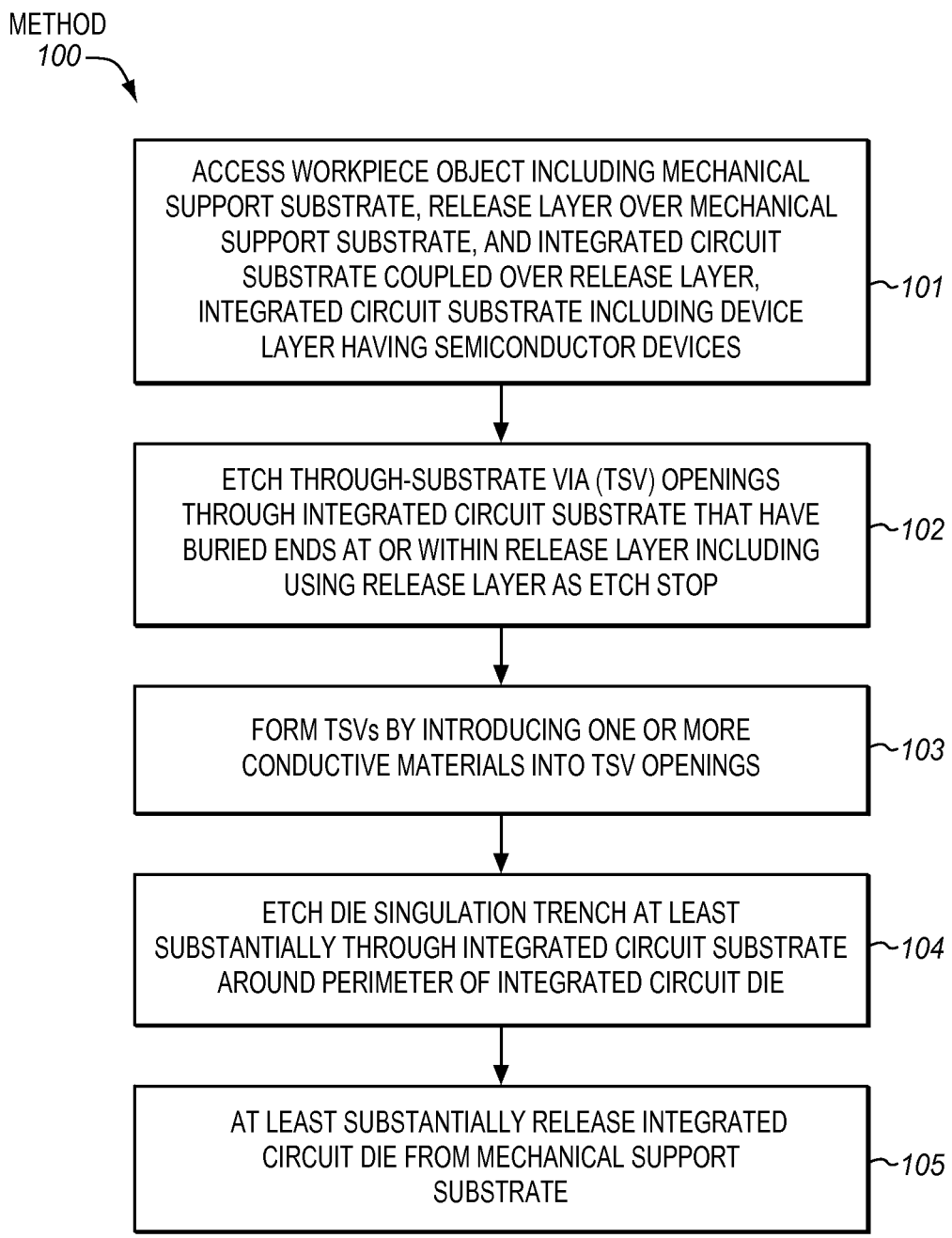
FIG. 1 is a block flow diagram of an embodiment of a method of forming through substrate vias (TSVs) and singulating and releasing integrated die from a mechanical support substrate.

FIG. 1 is a block flow diagram of an embodiment of a method 100 of forming through substrate vias (TSVs) and singulating and releasing integrated die from a mechanical support substrate. FIGS. 2A-2F are cross-sectional side views of embodiments of workpiece objects (e.g., in-process wafers or other intermediate substrates) at different stages of an embodiment of an approach for forming TSVs and singulating and releasing integrated die from a mechanical support substrate. To facilitate the description, the method of FIG. 1 will be described in conjunction with the views of FIGS. 2A-2F. The components, features, and optional details described for the workpiece objects of FIGS. 2A-2F also optionally apply to the operations and/or method of FIG. 1, which in embodiments may be performed using such workpiece objects. However, it is to be appreciated that the operations and/or method of FIG. 1 may be used with different substrates than those of FIGS. 2A-2F. Moreover, the workpiece objects of FIGS. 2A-2F may be used with different operations and/or a different method than that of FIG. 1.

The method includes accessing a workpiece object, at block 101. The workpiece object may represent an in-process wafer, other intermediate substrate, or other workpiece object used in an integrated circuit fabrication process. In some embodiments, the workpiece object may include a mechanical support substrate, a release layer over the mechanical support substrate, and an integrated circuit substrate coupled over the release layer. The integrated circuit substrate may include a device layer having semiconductor devices. As used herein, the term "accessing" the workpiece object refers broadly to any approach for taking hold of, grabbing, clasping, picking up, or otherwise accessing the workpiece object (e.g., manually or with a robotic arm). For example, a robotic arm or other equipment may grasp the workpiece object and place it in an etch chamber or otherwise introduce it into a piece of semiconductor processing equipment. Without limitation, the workpiece object may have been previously fabricated, purchased, traded for, or otherwise obtained or provided.

Figure 2A:
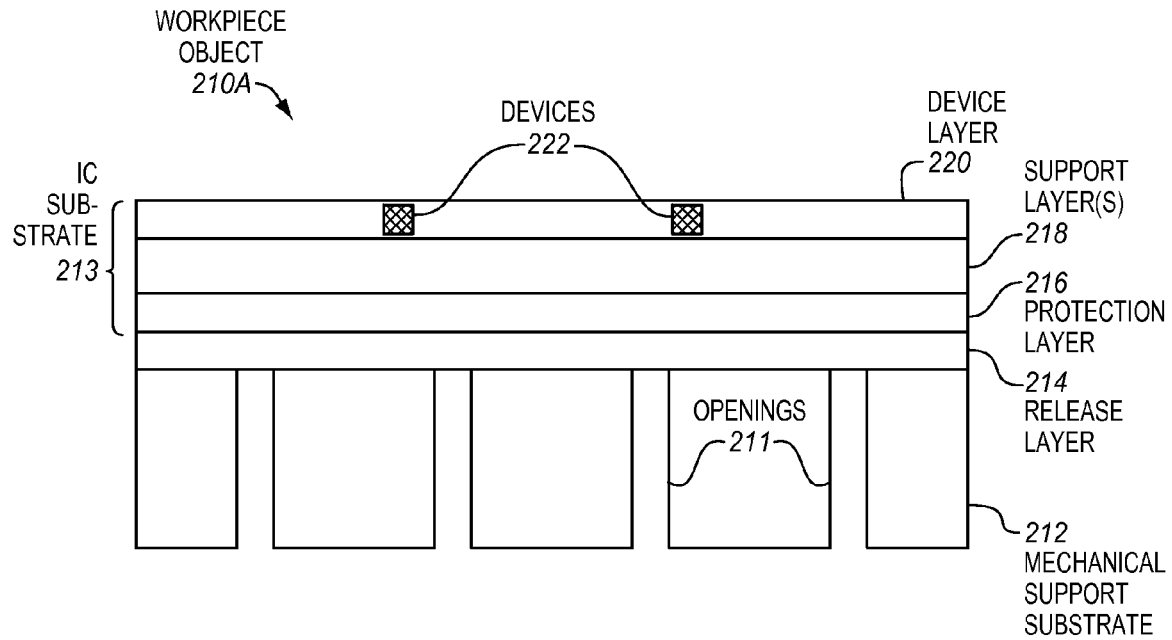
FIGS. 2A-2F are cross-sectional side views of embodiments of workpiece objects at different stages of an embodiment of an approach for forming through substrate vias (TSVs) and singulating and releasing integrated die from a mechanical support substrate.

Referring to FIG. 2A, an embodiment of a workpiece object 210A includes a mechanical support substrate 212, a release layer 214 over the mechanical support substrate, and an integrated circuit (IC) substrate 213 coupled over the release layer. In some embodiments, the integrated circuit substrate 213 may be very thin, such as, for example, having a thickness of less than about 50 micrometers (µm). The mechanical support substrate may represent any of various substrates operable to provide mechanical support to such a very thin integrated circuit substrate. A few representative examples of suitable mechanical support substrates include, but are not limited to, semiconductor wafers or other substrates, standard thickness silicon wafers or other substrates, ceramic substrates, glass substrates, quartz substrates, substrates of other suitable materials, specialized mechanical support substrates, and the like. As shown, in some embodiments, the mechanical support substrate may have holes or other openings 211 defined through its thickness, although this is not required. As will be explained further below, such openings may be used as etch access openings that may allow an etchant to be introduced into contact with the release layer 214. The mechanical support substrate may help to protect the integrated circuit substrate, which especially when it is very thin would otherwise tend to be fragile. The mechanical support substrate may also help to simplify the handling of the integrated circuit substrate, especially when it is very thin. Without the mechanical support substrate, specialized tools and equipment would generally be needed to handle a very thin integrated circuit substrate. Such specialized tools and equipment generally tend to be expensive.

The integrated circuit substrate 213 includes a semiconductor device layer 220 having semiconductor devices 222. The scope of the invention is not limited to any known type of semiconductor devices. Examples of suitable semiconductor devices include, but are not limited to, transistors, optoelectronic devices, photodiodes, semiconductor lasers (e.g., vertical-cavity surface-emitting lasers (VCSELs)), photovoltaic devices, data storage cells, microelectromechanical systems (MEMS), or the like. In some embodiments, the integrated circuit substrate 213 may optionally include a protection layer 216. As will be explained further below, in some embodiments, the optional protection layer 216 may remain in the final integrated circuit die, and may be operable to passivate and/or protect a surface of the integrated circuit die (e.g., to help protect the semiconductor devices 222). As shown, the optional protection layer 216 may be formed over the release layer 214. In some embodiments, the integrated circuit substrate 213 may optionally include one or more optional support layers 218, although this is not required. The one or more optional support layers 218 may optionally be included to provide further mechanical support to the semiconductor device layer 220. Especially when the device layer is very thin, it may be beneficial to include one or more of such optional support layers to provide additional mechanical support. As shown, the one or more optional support layers 218 may be formed over the protection layer 216 and/or between the device layer 220 and the release layer 214.

Referring again to FIG. 1, the method includes etching through-substrate via (TSV) openings through the integrated circuit substrate, at block 102. In some embodiments, the TSV openings may be etched with a reactive ion etch (RIE) and/or a deep reactive ion etch (DRIE). Alternatively, other etches known in the arts for etching relatively deep openings with relatively high aspect ratios may optionally be used. In some embodiments, etching the TSV openings may include using the release layer as an etch stop.

Figure 2B:
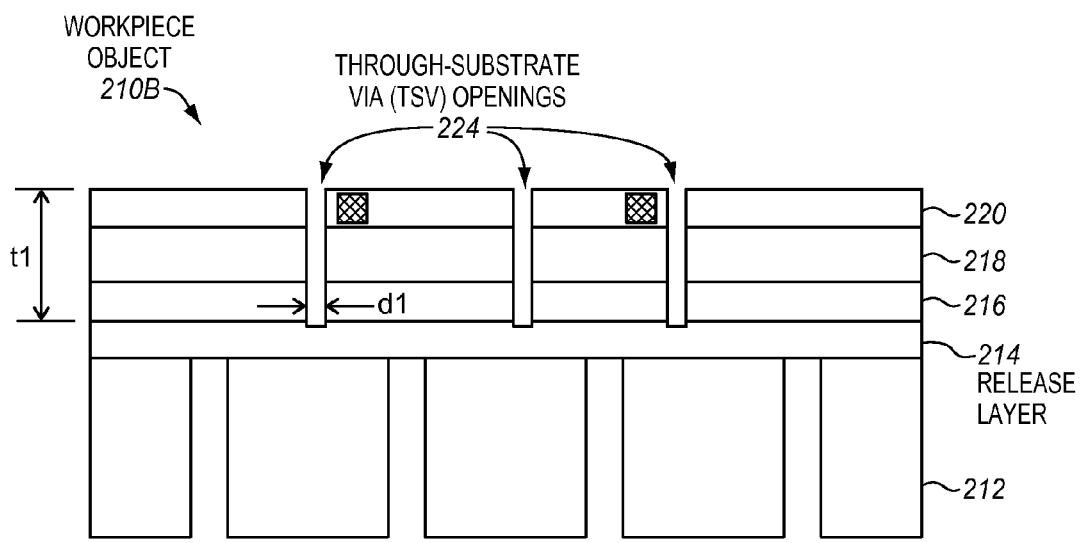

FIG. 2B shows an embodiment of a workpiece object 210B after etching TSV openings 224 through the integrated circuit substrate 213. By way of example, a reactive ion etch (RIE), a deep reactive ion etch (DRIE), or other etch capable of etching relatively deep openings with relatively high aspect ratios may be used. For example, a lithographic process may be employed in which a photoresist layer may be spin coated or otherwise deposited over the top surface, the photoresist layer may be photo-lithographically patterned and developed to form openings in the photoresist layer with positions and dimensions generally corresponding to the TSV openings, the etch may be performed in which an etchant is introduced through the photoresist openings to etch the portions of the integrated circuit substrate corresponding to the TSV openings, and then the photoresist layer may be stripped or otherwise removed.

As mentioned, in some embodiments, the release layer 214 may be used as an etch stop layer. As shown, in some embodiments, the TSV openings 224 may have buried terminal ends positioned at and/or slightly within the release layer. Advantageously, the use of the release layer to stop the etch used to form the TSV openings may help to make it easier to control when to stop the etch and/or may help to improve the uniformity of the positions of the ends of the TSV openings. Conventionally, when forming openings for through-silicon vias, such an etch stop layer is not used. As a result, there is typically at least 3% to 5% variation in the positions of the ends of the through-silicon via openings across the substrate. Such a relatively large amount of variation is generally undesirable. In some embodiments, through the use of the etch stop layer, the variations in the positions of the ends of the TSV openings may be maintained at no more than about 2% to 3%, although the scope of the invention is not so limited. Also, the conventional through-silicon via openings do not terminate at a release layer that allows etching, severing, or otherwise separating the integrated circuit substrate 213 from the mechanical support substrate 212. As a result, when forming conventional through-silicon vias, a via reveal type of operation is often needed to expose the ends of the through-silicon vias. Such a via reveal type of operation generally tends to incur various drawbacks known in the arts. However, by using the release layer as an etch stop layer, such via reveal type of operations may be avoided.

As shown, the TSV openings 224 may have a diameter or other cross-sectional dimension (d1). As also shown, the integrated circuit substrate 213 through which the TSV openings are formed may have a thickness (t1). Typically the diameters of the TSV openings may be relatively small. For example, in some embodiments, the diameters of the TSV openings may be less than about 2 μm, or in some embodiments less than about 1 μm. For example, in some embodiments, the diameters may range from about 0.1 μm to 0.8 μm, although the scope of the invention is not so limited. When forming such relatively small TSV openings it generally tends to be challenging to form them deeply into the substrate and/or through a relatively large thickness (t1) of the integrated circuit substrate. Such relatively small diameter and deep openings would have high aspect ratios that are often difficult to achieve unless exotic and often expensive technologies are employed. However, reactive ion etches, and especially deep reactive ion etches, generally tend to be well suited at forming relatively small diameter and relatively deep openings.

In some embodiments, the TSV openings 224 may extend entirely, or at least almost entirely, through the thickness (t1) of integrated circuit substrate 213. In some embodiments, the thickness (t1) of the integrated circuit substrate may be relatively thin. For example, the thickness (t1) of the integrated circuit substrate may be less than about 50 μm. In some embodiments, the diameter (d1) may range from about 0.1 rpm to 2 μm and the thickness (t1) may be no more than about 30 μm, although the scope of the invention is not so limited. In various embodiments, the diameters (d1) may be no more than about 1 μm and the thickness (t1) may be between about 5 μm to 25 μm, between about 5 μm to 20 μm, between about 5 μm to 15 μm, or between about 5 μm to 10 μm, as desired for the particular implementation. Advantageously, using integrated circuit substrates with such relatively small thickness (t1) may help to facilitate the formation of small diameter (d1) relatively high aspect ratio openings that are able to extend all the way through the entire thickness (t1) of the integrated circuit substrate using such approaches as RIE and DRIE. Moreover, extending the vias all the way through the integrated circuit substrate, down to the release layer 214, may help to avoid needing to perform a via reveal, back polishing operation, or the like to expose the bottoms of vias buried within a layer of material. Recall that the release layer may be etched, severed, or otherwise modified to release or separate the overlying layers from the mechanical support substrate, as will be described further below.

Handling such relatively thin integrated circuit substrates 213, if they were not attached to the mechanical support substrate 212, would tend to be challenging. Without the mechanical support substrate, such relatively thin integrated circuit substrates would generally tend to be fragile. Specialized tools and equipment would generally be needed to handle such relatively thin integrated circuit substrates, and such specialized tools and equipment generally tend to be expensive. However, the mechanical support substrate may help to protect the integrated circuit substrate, and may help to simplify the handling of the integrated circuit substrate. Most of the processing of the integrated circuit substrate, including the formation of the TSV openings, may be formed while the integrated circuit substrate is coupled over the mechanical support substrate. Consequently, there is no requirement to handle extremely thin substrates by themselves, which tends to be difficult.

As a further advantage, the use of the relatively thin integrated circuit substrate coupled with the mechanical support substrate, may help to allow relatively small diameter TSV openings to be formed (e.g., diameters less than about 1 μm) through an entire thickness of the integrated circuit substrate. There is no requirement to use a thick integrated circuit substrate for support and then subsequently need to backpolish the thick substrate to reveal the TSVs since the substrate was too thick to be able to etch the TSV openings through the entire thickness of the substrate. Moreover, the use of the mechanical support substrate may also facilitate the formation of relatively densely packed TSV openings. In some embodiments, a pitch of the TSV openings may range from about 1 μm to 8 μm, although the scope of the invention is not so limited. Forming relatively densely packed TSV openings may help to increase the amount of data that can be conveyed from the integrated circuit to other integrated circuits or signaling mediums, which may help to increase performance and/or functionality.

Figure 2C:
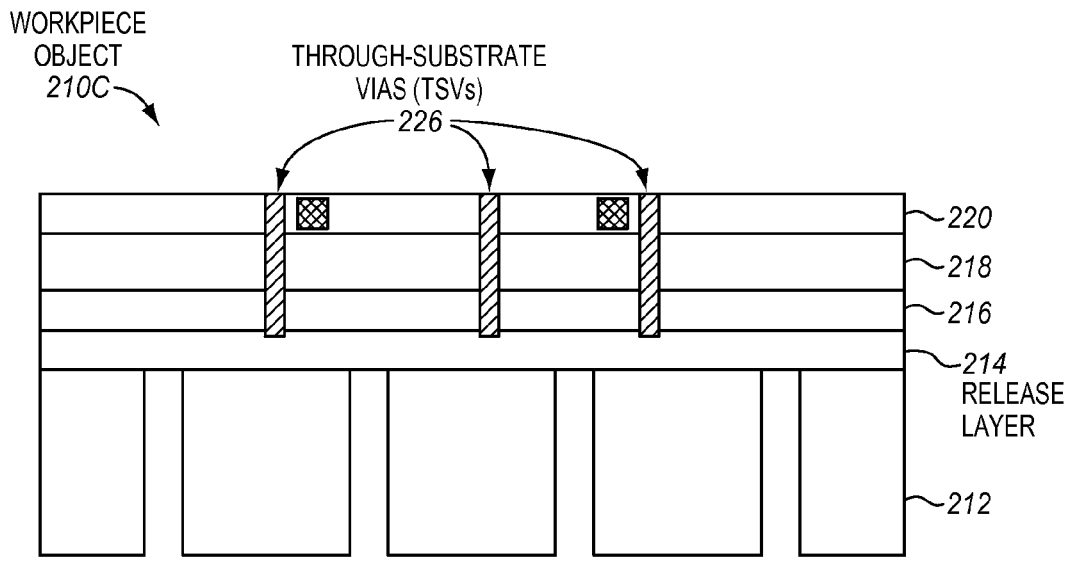

Referring again to FIG. 1, the method includes forming TSVs by introducing one or more metals or other conductive materials into the TSV openings, at block 103. FIG. 2C shows an embodiment of a workpiece object 210C having TSVs 226 formed by introducing one or more metals or other conductive materials into the TSV openings 224. As used herein, the term metal encompasses a pure metal as well as an alloy, stack, and other combination of one or more metals potentially with one or more non-metals as long as the combination remains sufficiently conductive for a TSV. In some embodiments, the TSVs may include an optional relatively thin outer liner layer or insulating layer and be filled with an interior conductive material. One example of a suitable TSV has a semiconductor oxide-nitride liner layer and is filled with tungsten or a tungsten alloy, although the scope of the invention is not so limited. Alternatively, other materials suitable for TSVs may optionally be used instead. The one or more metals or other conductive materials may be introduced by various approaches known in the arts, such as, for example, chemical vapor deposition (CVD), physical vapor deposition (PVD), atomic layer deposition (ALD), plating (e.g., electroless plating, electroplating), or the like, or a combination of such approaches. The TSVs may represent vertical electrical connectors or interconnects to allow electrical signals to be conveyed through the integrated circuit substrate (e.g., through an integrated circuit die formed therein). As will be discussed further below, the TSVs may be used to electrically couple an integrated circuit die with an electrical signaling medium (e.g., another integrated circuit die) above it and an electrical signaling medium (e.g., a printed circuit board or yet another integrated circuit die) below it.

Figure 2D:
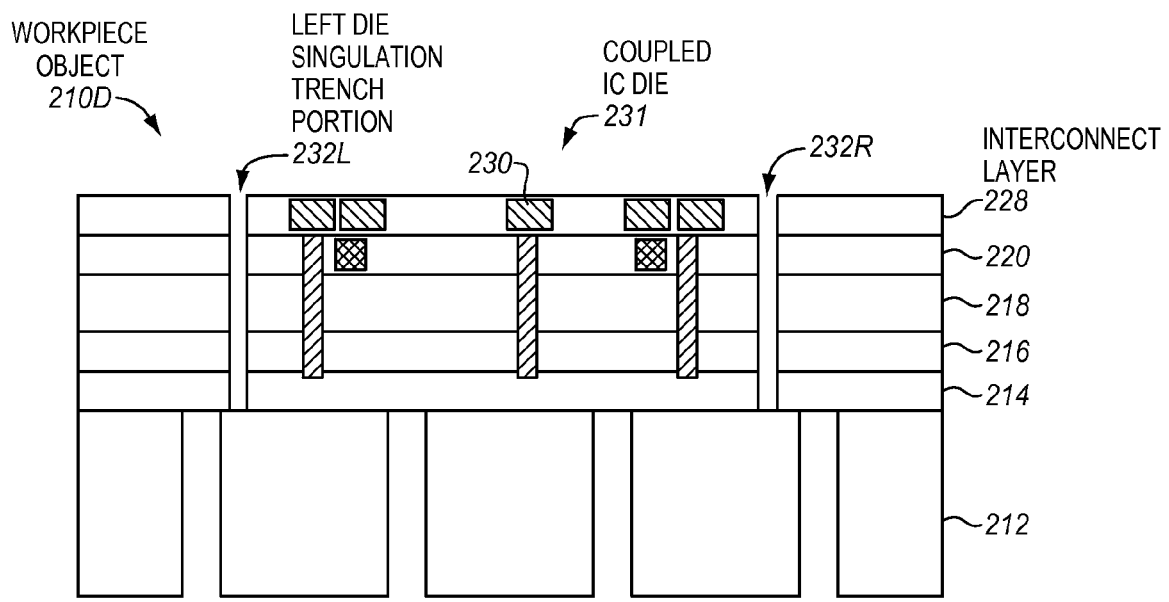

Referring again to FIG. 1, the method includes etching a die singulation trench at least substantially through the integrated circuit substrate around a perimeter of an intended integrated circuit die, at block 104. FIG. 2D shows an embodiment of a workpiece object 210D having a left die singulation trench portion 232L and a right die singulation trench portion 232R of a die singulation trench formed around a coupled integrated circuit die 231. In this cross-sectional side view, only the left and right die singulation trench portions are visible, although it is to be appreciated that the die singulation trench may completely, or at least substantially completely (e.g., typically at least 95%), surround the coupled integrated circuit die 231. The integrated circuit die may broadly represent a smaller substrate to be singulated or otherwise separated from a larger substrate represented by the integrated circuit substrate 213. As shown, in some embodiments, the die singulation trench may extend at least substantially through the entire thickness (t1) of the integrated circuit substrate 213. In the illustrated example, the die singulation trench also extends through the release layer 214 down to the top surface of the mechanical support substrate 212, although this is not required. In another embodiment, the die singulation trench may terminate at the top surface of, just above the top surface of, or within the release layer. In one aspect, a portion of the protection layer 216 may optionally be allowed to remain as an anchor or tether to help anchor or tether a released integrated circuit die, although this is not required.

As mentioned, in some embodiments, the die singulation trench 232L, 232R may be formed by etching. Etching the die singulation trench may represent a chemical based approach to form the die singulation trench, as opposed to a mechanical based approach like mechanical sawing. In some cases, the die singulation trench may be relatively narrow, for example, having a cross-sectional dimension that ranges from about 0.6 µm to about 5 µm, or from about 0.6 µm to about 3 µm, although the scope of the invention is not so limited. Reactive ion etches (RIEs) and especially deep reactive ion etches (DRIE) represent examples of suitable etches for forming narrow, deep, high aspect ratio trenches. Such narrow trenches are not required but may optionally be used to help increase the number of integrated circuit die that can be fit on a wafer and/or help to reduce material loss. When wider trenches are used various other types of etches known in the arts may be used to form the die singulation trenches, such as, for example, dry etches, xenon difluoride ($XeF_2$) etches, or the like.

Advantageously, using such an etch or chemical based approach to form the die singulation trench may offer advantages over a mechanical based approach like mechanical sawing. Mechanical sawing is a commonly employed approach for die singulation. However, due in part to the width of the saw blade, mechanical sawing is generally only able to form relatively wider die singulation openings or kerf that are often more than about 20 µm wide. In addition, the die singulation trenches or kerf often need to be offset from the active regions of the integrated circuit die (e.g., from the semiconductor devices 222) by relatively large distances often on the order of about 10 µm or more. This is due in part to the fact that mechanical sawing generally tends to cause small cracks (e.g., microcracks), fractures, scratches, abrasions, chips, or like forms of mechanical damage when creating the singulation sidewalls. Another singulation approach known as stealth dicing uses a laser to create cracks or fissures that are used to split the wafer. Such cracks, fissures, or splits also represent forms of mechanical damage. Both the wider die singulation trenches or openings as well as the offset distances tend to waste a significant amount of wafer material and/or reduce the number of integrated circuit die that can be fit on a wafer, especially when the sizes of the integrated circuit die are not large in relation to the widths of the die singulation trenches and/or the offset distances. This in turn tends to increase the manufacturing costs per integrated circuit die when mechanical sawing is used. In contrast, etched die singulation trenches may optionally allow more integrated circuit die to fit on the integrated circuit substrate with higher packing densities, which may help to reduce per-die manufacturing costs.

Moreover, as compared to die singulation trenches formed by mechanical sawing, the etched sidewalls of the die singulation trench may be substantially smoother and/or have less mechanical damage of the type caused by mechanical sawing. For example, the etched sidewalls may be relatively free of cracks (e.g., microcracks), fractures, scratches, abrasions, chips, and like forms of mechanical damage typically caused by mechanical sawing. There may be no saw blade scratches in the etched sidewalls of the etched die singulation trenches.

Furthermore, using such an etch or chemical based approach to form the die singulation trench may optionally allow die singulation trenches of various different shapes to be formed. With mechanical sawing based die singulation generally only square or rectangular shaped die singulation trenches are feasible. However, when a lithographic etch is used, arbitrarily shaped die singulation trenches may be patterned. For example, polygons (e.g., triangles, squares, rectangles, pentagons, hexagons, octagons), circles, ovals, semicircles, irregular shapes, combinations of such shapes, and the like, may optionally be formed. In one aspect, the ability to form such arbitrarily shaped integrated circuit die may help to increase the flexibility of the design or layout of stacked three-dimensional (3D) integrated circuit assemblies or packages. Alternatively, mechanical saw based singulation, stealth dicing, or other singulation approaches may optionally be used, if desired.

FIG. 2D also shows an interconnect layer 228 formed over the device layer 220. The interconnect layer has interconnects 230. The interconnect layer and the interconnects may represent generally conventional components formed by generally conventional approaches. An exemplary embodiment would be the metal interconnect layers formed with traditional CMOS processing.

Figure 2E:
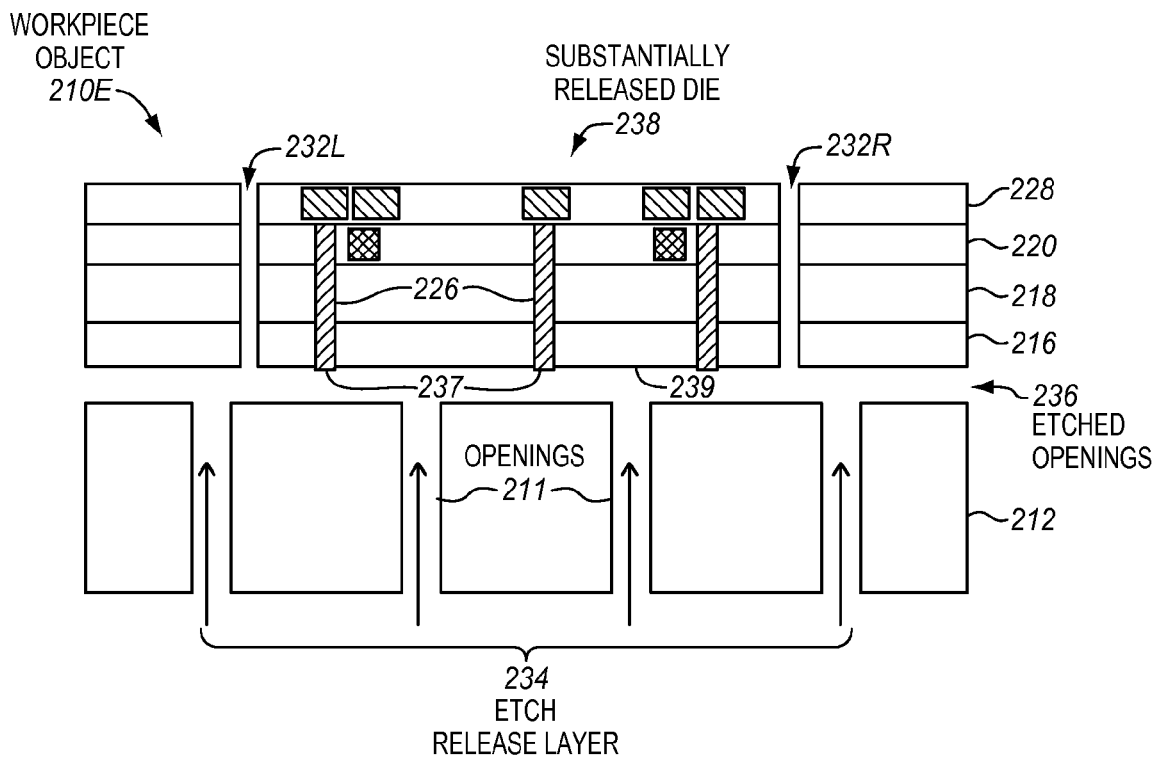

Referring again to FIG. 1, the method includes releasing or at least substantially releasing the integrated circuit die from the mechanical support substrate, at block 105. In some embodiments, the release layer may be etched to release or at least substantially release the integrated circuit die from the mechanical support substrate. FIG. 2E shows an embodiment of a workpiece object 210E where an etch of the release layer 234 is used to form etched openings 236 defined where material of the release layer 214 is removed by the etch. The etch may form substantially released die 238. In the illustrated embodiment, the etch is performed through the openings 211 defined through the mechanical support substrate, although this is not required. The openings are used as etch access openings to allow the etch (e.g., an etchant medium) to access the release layer. Alternatively, as another option, the etch may be performed through the die singulation trenches 232R, 232L, if desired. In the illustrated embodiment, the entire release layer has been removed, although in other embodiments a portion of the release layer may be allowed to remain (e.g., as a protuberance or shaped structure etched from the release layer to help reduce stiction between the integrated circuit device and the mechanical support substrate).

Notice that the etch 234 of the release layer 214 may expose the bottom terminal ends 237 of the TSVs 226. Since the TSVs were formed down to or slightly within the release layer, which in embodiments was an etch stop layer for the etch used to form the TSV openings 224, there is no need to perform a backpolishing operation or via reveal type of operation. Rather, the etch of the release layer may be used to expose the bottom terminal ends 237 of the TSVs. Notice also that the etch of the release layer may expose the bottom surface 239 of the optional protection layer 216. The optional protection layer may have been formed directly on the release layer between the device layer 220 and the mechanical support substrate 212. In some embodiments, the optional protection layer may remain in the final integrated circuit die, and may be operable to passivate and/or protect a surface of the integrated circuit die (e.g., to help protect the semiconductor devices 222). For example, the protection layer may help to hermetically seal and protect the semiconductor devices 222 from external medium (e.g., water, oxygen, etc.). Examples of suitable protection layers include, but are not limited to, oxides of silicon or other semiconductors, nitrides of silicon or other semiconductors, oxide-nitrides of silicon or other semiconductors, and other types of materials conventionally used for passivation and/or protection layers for integrated circuits.

In some embodiments, the release layer 214 may include various materials that are capable of being selectively etched by the etch 234 without significantly etching or damaging the other exposed materials (e.g., the protection layer 216, the filled TSVs 226, etc.). As one particular example, the release layer may represent an amorphous silicon layer or germanium layer, the protection layer 216 may represent a silicon oxide-nitride layer, the TSVs may have a silicon oxide-nitride liner layer and be filled with a tungsten material, and the etch 234 may represent a xenon difluoride ($XeF_2$) etch or a hydrogen peroxide ($H_2O_2$) etch, although the scope of the invention is not so limited. Such an etch may etch the amorphous silicon or germanium of the release layer without substantially etching the protection layer or the TSVs. Alternatively, other materials and corresponding etches known in the arts may optionally be used.

FIG. 2E illustrates an embodiment in which an etch 234 of the release layer 214 has been used to release or at least substantially release the integrated circuit die 238 from the mechanical support substrate 212, although the scope of the invention is not so limited. In other embodiments, the integrated circuit die may be released or at least substantially released using other approaches (e.g., by otherwise damaging, compromising, modifying, or processing the release layer). For example, in some embodiments, the release layer may include a material that is capable of absorbing a given actinic radiation, and releasing or substantially releasing the integrated circuit die based on the absorption of the actinic radiation. By way of example, the release layer may include a germanium layer that is capable of absorbing high intensity infrared radiation, for example, from an infrared laser. As one example, the radiation may involve photons having a wavelength of more than about 1.2 µm and energy of less than about one electron volt (eV). The germanium layer may absorb such radiation significantly more compared to silicon and various other materials. This may help to provide an optically based method of separation.

Figure 2F:
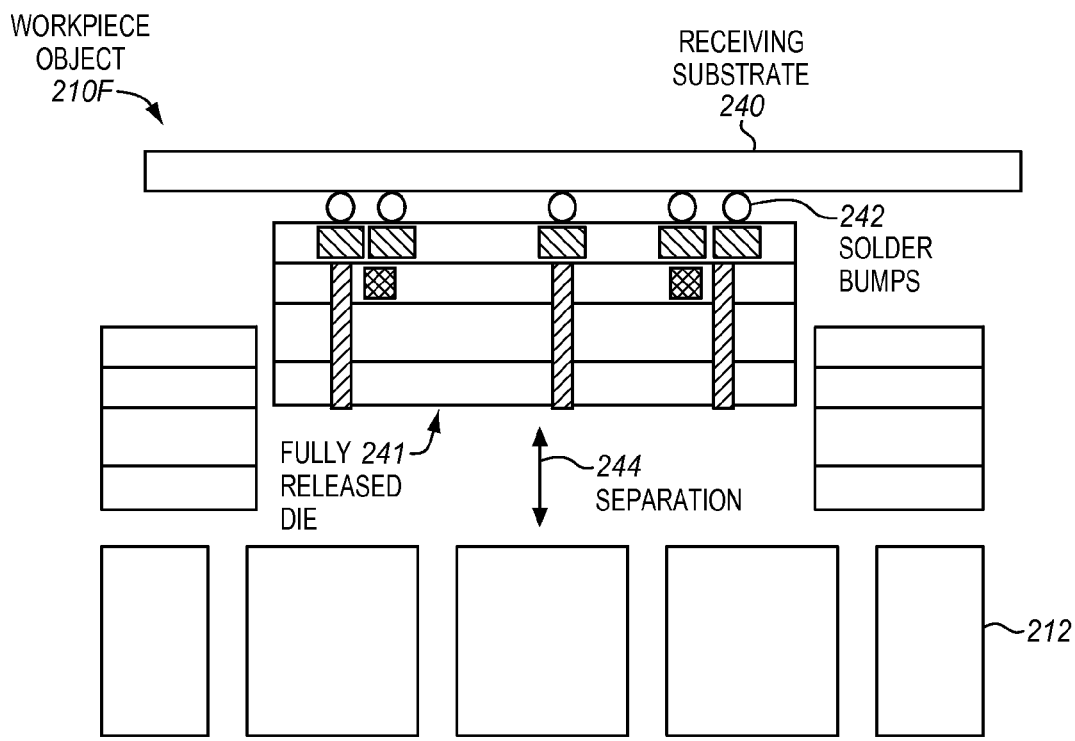

FIG. 2F shows an embodiment of a workpiece object 210F where a released die 241 is separated 244 from the mechanical support substrate 212. As shown, in some embodiments, a receiving substrate 240 may be coupled with the top of the substantially released integrated circuit die 238, and then the receiving substrate and the released integrated circuit die 241 may be separated from the mechanical support substrate. In various aspects, the receiving substrate may be moved relative to the mechanical support substrate, the mechanical support substrate may be moved relative to the receiving substrate, or both the receiving substrate and the mechanical support substrate may be moved relative to one another. The coupling of the receiving substrate 240 with the substantially released integrated circuit die 238 may be physically stronger than the coupling of the substantially released integrated circuit die 238 devices with the mechanical support substrate 212. As a result, the substantially released integrated circuit die may remain bonded or coupled with the receiving substrate during the separation. In some embodiments, the separation may involve breaking a relatively weak anchor or tether (e.g., a small bridge of material allowed to remain coupling the substantially released integrated circuit die with an adjacent fixed structure, a dab of photoresist applied between the substantially released integrated circuit die and an adjacent fixed structure, or the like) used to hold the substantially released die 238 coupled with the substrate to help prevent it from sliding or falling.

In the illustrated embodiment of FIG. 2F, the receiving substrate 240 has been coupled with the substantially released die 238 after the etch 234 of the release layer 214. In another embodiment, the receiving substrate may be coupled with the coupled integrated circuit die 231 prior to etch the release layer or otherwise releasing or substantially releasing the integrated circuit die. In such an embodiment, the receiving substrate may help to hold the substantially released die in place after the etch of the release layer. This may help to hold the subsequently released integrated circuit die in place without needing to use a dedicated anchor or tether.

Examples of suitable receiving substrates 240 include, but are not limited to, transfer tapes, integrated circuit carriers, integrated circuit carrier tapes, assembly trays, organic chip carriers, circuits, printed circuit boards, organic circuit boards, flexible printed circuit boards, rigid printed circuits, ceramic chip carriers, or the like. As shown, in some embodiments, reflowed solder bumps 242 may optionally be used to electrically and physically couple the receiving substrate with the released integrated circuit die. Electrical contacts of the receiving substrate may be aligned and coupled with mating or corresponding electrical contacts of the released integrated circuit die through the reflowed solder bumps. Alternatively, instead of solder bumps, other portions of solder, other metal bumps, other metal particles, other reflowable metals, other reflowable conductive materials, conductive adhesives, or the like, may be used as the electrical coupling members. As another option, in some embodiments, an adhesive material may be used to physically couple the receiving substrate with the released integrated circuit die. For example, the receiving substrate may have an adhesive applied to a surface intended to contact the released integrated circuit die. A combination of reflowed solder bumps (or other electrical couplings) and an adhesive material may also optionally be used.

In some embodiments, the separation of the receiving substrate 240 from the mechanical support substrate 212 may involve a wafer-level lift off of multiple or potentially many released integrated circuit die. In some embodiments, all of the released integrated circuit die may be lifted off in one such lift-off operation with one receiving substrate. Alternatively, different groups or subsets of the released integrated circuit die may be lifted off during different lift-off operations with different receiving substrates. For example, two, three, or four, or more of such lift-off operations may be used to separate substantially all of the released integrated circuit die from off the mechanical support substrate. Advantageously, such ability to separate the released integrated circuit die from the substrate through the use of the receiving substrate may represent an efficient way to handle the released integrated circuit die and/or allow efficient assembly into a module, package, or other deployment. Often, parallel or concurrent transfers of devices tend to reduce the assembly cost per assembled device. Alternatively, instead of using such a receiving substrate, a pick-and-place machine may optionally be used to extract or separate individual integrated circuit die from the mechanical support substrate. For example, a vacuum tip or other tip of the pick-and-place machine may be used to contact the integrated circuit die and remove it from the mechanical support substrate. Such chip-level assembly may help to increase assembly and/or configuration flexibility and may optionally allow for known-good-die selection. Accordingly, in various embodiments, assembly may be carried out using wafer-to-wafer transfers, chip-to-wafer transfers, chip-to-chip transfers, or some combination.

Figure 3:
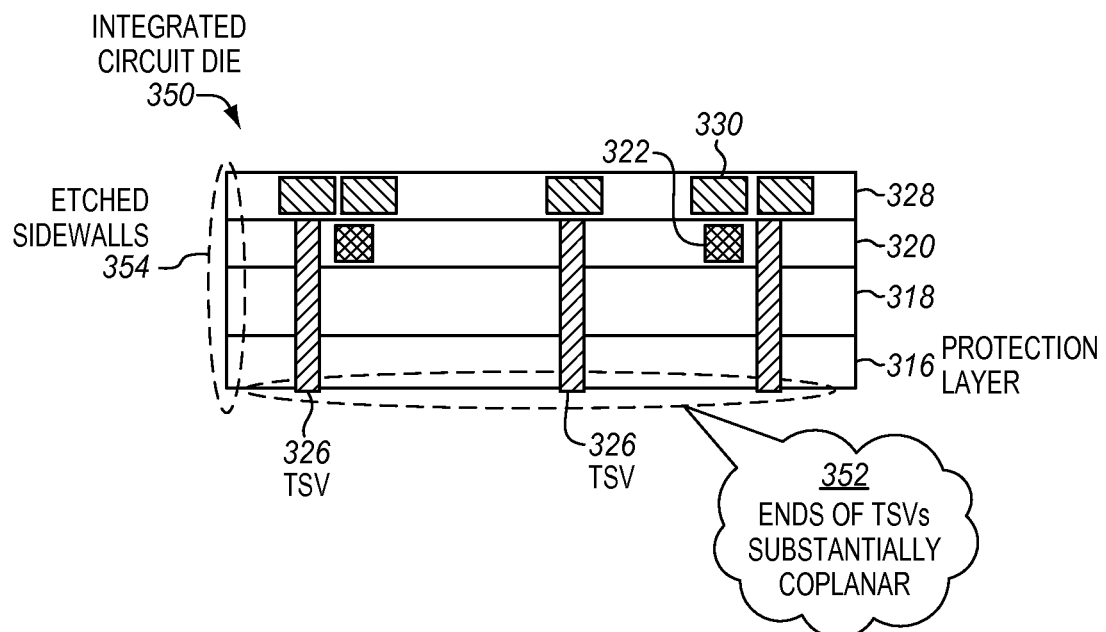
FIG. 3 is a cross-sectional side view of an embodiment of a separated integrated circuit die.

FIG. 3 is a cross-sectional side view of an embodiment of a separated integrated circuit die 350. The separated integrated circuit die includes a device layer 320 having semiconductor devices 322. Any of the previously mentioned types of semiconductor devices are suitable. An interconnect layer 328 having interconnects 330 is formed over the device layer 320. Conventional interconnect layers and interconnects are generally suitable. One or more optional support layers 318 may optionally be included under the device layer 320. An optional protection layer 316 may optionally be included below the one or more optional support layers 318 and/or the device layer 320. As shown, in some embodiments the protection layer may serve as an exposed external surface or layer for the integrated circuit die and may help to passivate or protect it (e.g., help to protect the semiconductor devices 322). In some embodiments, the protection may have been initially present in the starting layers used to form the integrated circuit die and may remain in the finally formed integrated circuit die as an external exposed protection layer. Advantageously, there is no need to form a separate passivation or protection layer.

The integrated circuit die includes through-substrate vias (TSVs) 326. In some embodiments, the TSVs may have a diameter of less than about 1 μm, for example ranging from 0.1 μm to 0.8 μm. As shown, the TSVs may extend through the device layer 320, the one or more optional support layers 318, and the optional protection layer 316. In some embodiments, the lengths of the TSVs and/or the thickness of these layers through which the TSVs extend may be no more than about 25 μm, although the scope of the invention is not so limited. In some embodiments, the TSVs may be formed with a pitch of less than 10 μm, for example ranging from about 1 μm to 8 μm, although the scope of the invention is not so limited. The TSVs may have terminal ends at or extending from the exposed bottom surface of the integrated circuit die. For example, in the illustrated embodiment, the ends of the TSVs extend slight from the protection layer 316. In some embodiments, the terminal ends of the TSVs may be substantially coplanar 352. For example, the positions of the terminal ends of the TSVS may vary by less than about 3% across the integrated circuit die. In some embodiments, as will be explained in conjunction with FIG. 4, the terminal ends of the TSVs may have an increased diameter.

In some embodiments, the integrated circuit die may have etched sidewalls 354. In some embodiments, the etched sidewalls may be substantially free of mechanical damage of the type caused by die singulation through sawing. For example, the etched sidewalls may be free or substantially free of any scratches, cuts, saw marks, or the like caused by mechanical sawing with a saw blade (e.g., scratches from the blade). In some embodiments, the etched sidewalls may also be substantially free of mechanical damage of the type caused by stealth dicing. For example, the etched sidewalls may be free or substantially free of cracks, fissures, splits, or other such damage caused by heating a material with a laser to induce cracking or fissuring.

Figure 4:
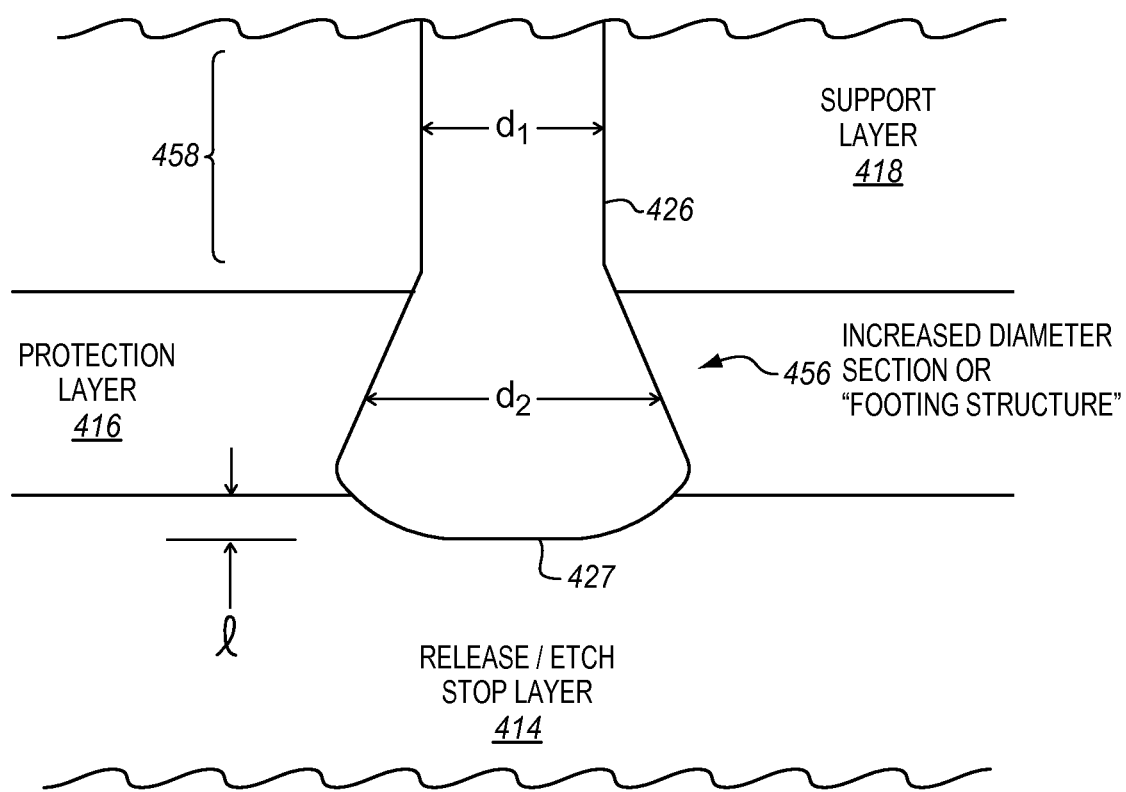
FIG. 4 is a cross-sectional side view of an embodiment of a portion of a TSV near a terminal end.

FIG. 4 is a cross-sectional side view of an embodiment of a portion of a TSV 426 near a terminal end 427 of the TSV. Also shown is a portion of a support layer 418, a protection layer 416, and a release layer 414. In some embodiments, the release layer may serve as an etch stop layer for an etch that was used to form a TSV opening for the TSV 426. An upper portion 458 of the TSV extends through the support layer 418. A lower terminal portion 456 of the TSV extends through the protection layer 416 and slightly into the release and/or etch stop layer 414. As shown, the upper portion 458 may have a first smaller diameter (d1), while the lower terminal portion 456 may have a second larger diameter (d2). The lower terminal portion 456 having the larger diameter (d2) may represent a terminal increased diameter section or "footing structure." The TSVs may have a greater diameter at and near the interface with the etch stop layer than a diameter of the overlying upper portion 458.

Without wishing to be bound by theory, it is presently believed that such increased diameter sections or footing structures 456 may be due in part to the release layer 414 being operable to serve as an etch stop. Etchant reaching the release and/or etch stop layer at the bottom of the opening may be relatively less capable of further etching the release and/or etch stop layer vertically downward (as viewed) and may rather etch relatively more laterally or in the horizontal direction (as viewed) into the protection layer 416 thereby creating the increased diameter terminal section. This may also be true for other materials at the interface with such an stop layer besides just the protection layer 416. Conventionally, such increased diameter terminal sections are generally not observed because etch stop layers are not conventionally used to form through-silicon vias. One possible advantage of such increased diameter terminal section is that they may provide an increased area for electrical contact. For example, they may help to provide an increased surface area to align and/or couple a solder bump, or other electrically conductive material during integration. It is to be appreciated that the particular illustrated shape of the increased diameter section is only an example and is not required.

Figure 5:
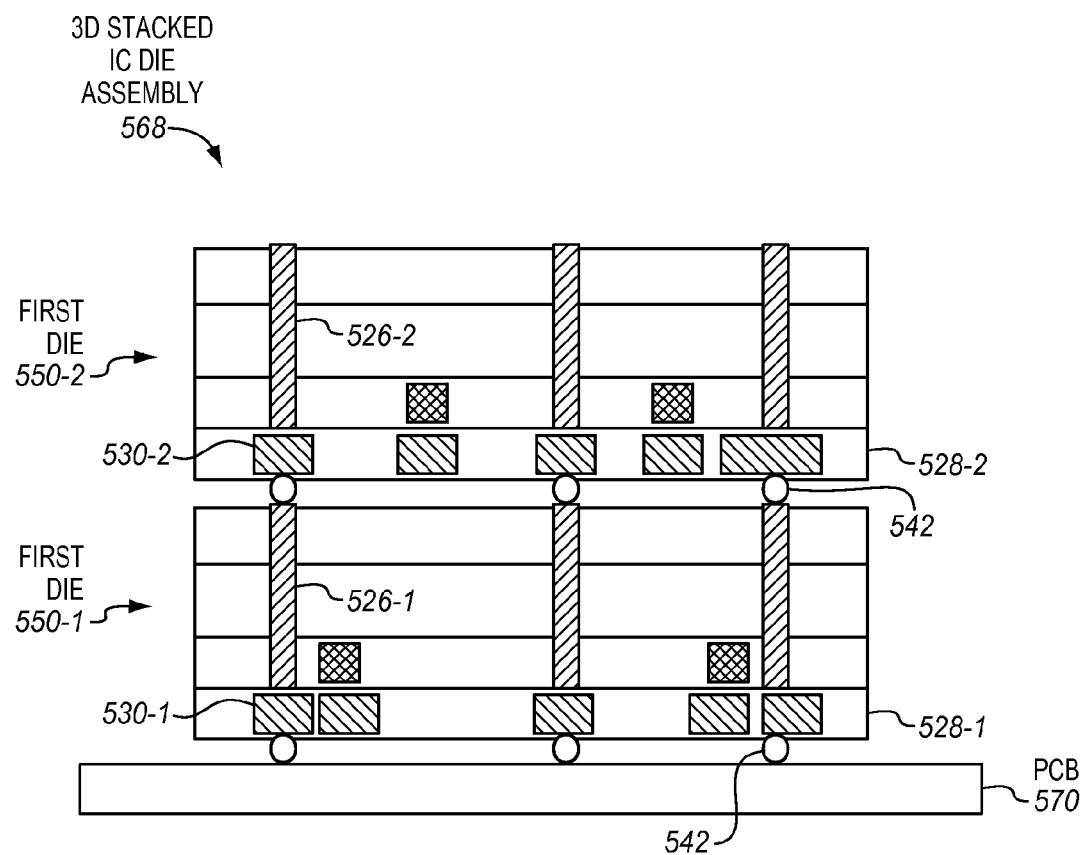
FIG. 5 is a cross-sectional side view of a three-dimensional stacked integrated circuit die assembly.

FIG. 5 is a cross-sectional side view of a three-dimensional (3D) stacked integrated circuit die assembly 568. By way of example, the assembly may represent a chip stack multi-chip module, a system-in-a-package, or other assembly having multiple stacked die. The stacked die assembly includes a printed circuit board (PCB) 570, a first die 550-1 physically and electrically coupled with the PCB, and a second die 550-2 stacked vertically over the first die and physically and electrically coupled with the first die. Interconnects 530-1 of a first interconnect layer 528-1 of the first die are electrically coupled with corresponding interconnects (not shown) of the PCB, for example, through reflowed solder bumps 542. Alternatively, a conductive adhesive or other electrical coupling material or member may optionally be used. Lower ends of TSVs 526-1 of the first die are coupled with the interconnects 530-1. Upper ends of the TSVs 526-1 are electrically coupled with interconnects 530-2 of the second die, for example, through reflowed solder bumps 542. Alternatively, other electrical coupling materials or members may optionally be used. The TSVs 526-1 may be used to convey electrical signals vertically across the first die between the first die and the second die and/or between the PCB and the second die. Likewise, optional TSVs 526-2 of the second die may optionally be used to convey electrical signals across the second die to another signaling medium (not shown). Advantageously, the die produced by the methods and approaches disclosed herein generally tend to be well suited for incorporation in a multi-die assembly (e.g., a 3D stacked die assembly).

There are various reasons why it may be desirable to form an assembly of multiple die. For one thing, different types of semiconductor materials tend to be better suited than others for different types of applications. For example, silicon based semiconductor materials tend to be well suited for digital logic type capabilities. As a result, presently most state-of-the-art microprocessors are fabricated using such silicon based materials. In other instances, certain capabilities or functionalities may not currently be realized as efficiently and/or effectively in silicon based semiconductor materials as compared to other types of semiconductor materials. For example, this may be the case for certain capabilities, such as, for example, optoelectronic capabilities (e.g., light generation, light detection, photovoltaics, etc.), high frequency handling capabilities, high power handling capabilities, low noise generation capabilities, or the like. As a result, it is sometimes desirable to use non-silicon semiconductor materials, such as, for example, gallium arsenide, indium phosphide, silicon carbide, germanium, gallium nitride, various group III-V compound semiconductor materials, or the like. However, it is often difficult to combine such different types of semiconductor materials monolithically on the same wafer or substrate. For example, these different types of materials generally need to be processed with substantially different processes and/or there may be material incompatibility or coefficient of thermal expansion mismatch type issues. Moreover, it is often even difficult to monolithically combine silicon based semiconductor materials on the same wafer or substrate when different processes have been optimized to achieve different capabilities or functionalities. For example, this may be the case for silicon based digital logic and silicon based data storage (e.g., DRAM). This may also be the case for silicon based digital logic and silicon based capabilities such as high frequency handling, high power handling, low noise generation, or other specialized capabilities.

It is to be appreciated that various different approaches are suitable for forming a starting workpiece object suitable for embodiments (e.g., the workpiece object 210A of FIG. 2A). The approaches may be based on wafer bonding or otherwise coupling already formed layers or substrates over the mechanical support substrate, forming the layers by deposition processes over the mechanical support substrate or layers or substrates already firmed or coupled thereover, or a combination of such approaches.

Figure 6:
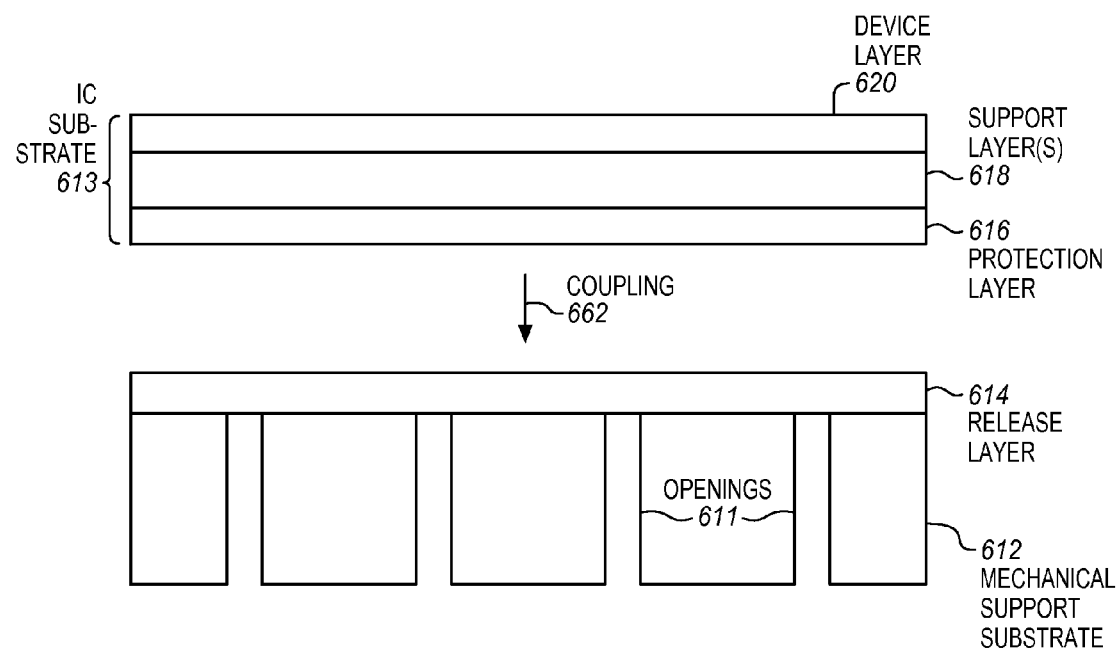
FIG. 6 is a cross-sectional side view of an embodiment of an approach for coupling an integrated circuit substrate with a mechanical support substrate.

FIG. 6 is a cross-sectional side view of an embodiment of an approach for bonding or otherwise coupling 662 an integrated circuit substrate 613 with a mechanical support substrate 612. In the illustrated embodiment, the integrated circuit substrate 613 includes an optional protection layer 616, one or more optional support layers 618 over the optional protection layer, and a device layer 620 over the one or more optional support layers. These layers may be the same as or similar to the correspondingly named layers described elsewhere herein. The illustrated mechanical support substrate 612 has a release layer 614 formed over its upper surface. Alternatively, the release layer 614 may optionally instead by provided as a lowermost layer of the integrated circuit substrate 613. In other embodiments, other layers (e.g., the protection layer 616) may optionally be formed over the mechanical support substrate (e.g., by a deposition process). The illustrated mechanical support substrate optionally has holes 611, although this is not required.

In the illustrated embodiment, the already formed integrated circuit substrate 613, which in embodiments may be a very thin substrate, may be wafer bonded or otherwise coupled with the upper surface of the release layer 614. Various approaches are known in the arts to form very thin substrates including crystalline semiconductor materials. Examples of suitable approaches include, but are not limited to, those based on or similar to Smart Cut technology, approaches using SIMOX (Separation by IMplantation of Oxygen) type approaches, and others known in the arts. Alternatively, in other embodiments, a bond-and-backgrind type of approach may optionally be used. For example, a thicker substrate may be water bonded or otherwise coupled with the mechanical support substrate, and then the thicker substrate may be backpolished or otherwise thinned to form a very thin integrated circuit substrate. As another option, a combination of such different approaches may optionally also be used where different portions of the layers of the integrated circuit substrate 616 are applied or formed using different approaches in different stages. For example, a bond-and-backgrind type of approach may be used to form the one or more relatively thicker support layers 618, for example having a thickness ranging from about 5 µm to about 20 µm, or from about 5 µm to about 10 µm, and then a Smart Cut or SIMOX based approach may be used to form a very thin device layer 620, for example having a thickness ranging from about 0.1 µm to about 5 µm. As another option, the device layer 620 may be formed by epitaxial growth over the mechanical support substrate. These are just a few illustrative examples. The scope of the invention is not limited to any known such approach.

Figure 7:
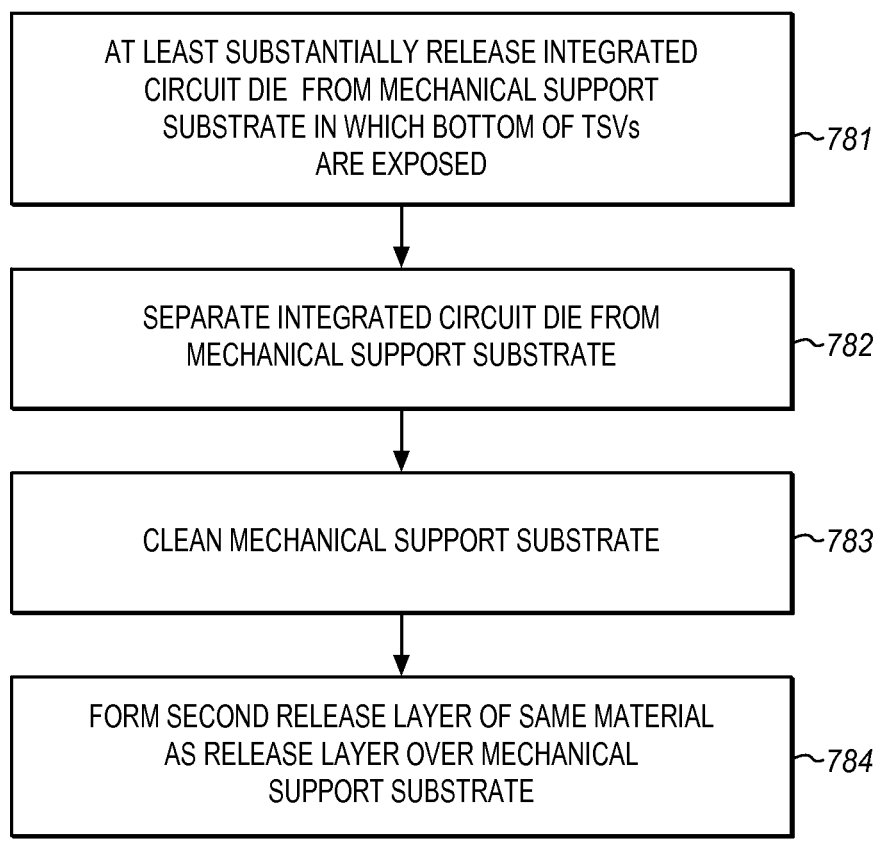
FIG. 7 is a block flow diagram of an embodiment of a method of reusing a mechanical support substrate.

FIG. 7 is a block flow diagram of an embodiment of a method 780 of reusing a mechanical support substrate. The method includes at least substantially releasing an integrated circuit die from a mechanical support substrate in which bottoms of the TSVs are exposed, at block 781. In some embodiments, this may include etching a release layer between an integrated circuit die and the mechanical support substrate until the integrated circuit die is at least substantially released from the mechanical support substrate. Alternatively, exposure to actinic radiation may optionally be used. In some embodiments, this may be done using any of the approaches described for FIG. 2E. In some embodiments, the etch may also expose terminal ends of TSVs extending to or within the release layer, although this is not required. The integrated circuit die is separated from the mechanical support substrate, at block 782. In some embodiments, this may be done using any of the approaches described for FIG. 2F. The mechanical support substrate is cleaned of residual materials and/or structures, at block 783. For example, the mechanical support substrate may be cleaned by etching, polishing (e.g., chemical mechanical polishing), grinding, planarizing a surface, or the like. A second release layer of the same material as the release layer that was etched (i.e., in block 781) is formed over the mechanical support substrate, at block 784. For example, this may include depositing the release layer over the mechanical support substrate by a material deposition process, or bonding an already formed release layer to the mechanical support substrate. Advantageously, the ability to reuse the substrate may help to reduce manufacturing costs.

In the various embodiments disclosed herein, embodiments of TSVs and their formation have often been shown and/or described together with other aspects such as die singulation through etching, using very thin integrated circuit substrates over a mechanical support substrate, etc. However, in other embodiments, the TSVs may be used either with or without die singulation through etching, the TSVs may be used either with or without very thin integrated circuit substrates over a mechanical support substrate, etc. That is, the description of these aspects together, which has been used to streamline the disclosure and facilitate the description and understanding, is not meant to imply that these various aspects need to be used together in the same embodiment.

Components, features, and details described herein for any of the workpiece objects, intermediate substrates, etc. may also optionally be used in any of the methods performed on or with them. For example, the operations, features, and other details described for any of FIGS. 2A-2F, FIG. 3, FIG. 4, and FIG. 6 may also optionally be used in the method of FIG. 1. Also, the operations, features, and other details described for FIG. 2D-2F may also optionally be used in the method of FIG. 7. Also, the features and optional details described for FIG. 4 may optionally be used for the die of FIG. 3 or the assembly of FIG. 5.

The terms "coupled" and "connected," along with their derivatives, may be used herein. These terms are not intended as synonyms for each other. Rather, in particular embodiments, "connected" may be used to indicate that two or more elements are in direct physical and/or electrical contact with each other. "Coupled" may mean that two or more elements are in direct physical or electrical contact with each other. However. "coupled" may also mean that two or more elements are not in direct contact with each other. For example, an integrated circuit substrate may be coupled with a mechanical support substrate through one or more intervening elements (e.g., layers, materials, structures, etc.). Similarly, a first element "over" a second element may refer to either the first element directly "on" the second element, or there may be one or more intervening elements disposed between the first and second elements. Furthermore, it should be noted that terms such as "over," "under," "top," "bottom," "vertical," "horizontal," and the like, are used herein to refer to the structures as viewed in the illustrations, although the structures may be used in a variety of different orientations.

The semiconductor devices separated as disclosed herein may include any of a wide variety of different types of semiconductor devices known in the arts. Examples of suitable semiconductor devices include, but are not limited to, transistors, CMOS type semiconductor devices, optoelectronic devices, photodiodes, semiconductor lasers (e.g., vertical-cavity surface-emitting lasers (VCSELs)), photovoltaic cells, MEMS, dynamic random access memory (DRAM), and others known in the arts. The integrated circuit die including such semiconductor devices may be used in a variety of different modules, electronic devices, and/or systems. For example, integrated circuits disclosed herein may be used in computer systems, digital cameras, cell phones, communications equipment, and various other types of electronic devices known in the arts.

In the description above, for the purposes of explanation, numerous specific details have been set forth in order to provide a thorough understanding of the embodiments. It will be apparent however, to one skilled in the art, that one or more other embodiments may be practiced without some of these specific details. The particular embodiments described are not provided to limit the invention but to illustrate it. The scope of the invention is not to be determined by the specific examples provided above but only by the claims below. In other instances, well-known structures, devices, and operations have been shown in block diagram form or without detail in order to avoid obscuring the understanding of the description. Where considered appropriate, reference numerals or terminal portions of reference numerals have been repeated in the figure to indicate corresponding or analogous elements, which may optionally have similar characteristics.

It should also be appreciated that reference throughout this specification to "one embodiment", "an embodiment", "one or more embodiments", or "different embodiments", for example, means that a particular feature may be included in the practice of the invention. Similarly, it should be appreciated that in the description, various features are sometimes grouped together in a single embodiment, figure, or description thereof for the purpose of streamlining the disclosure and aiding in the understanding of various inventive aspects. This method of disclosure, however, is not to be interpreted as reflecting an intention that the invention requires more features than are expressly recited in each claim. Rather, as the following claims reflect, inventive aspects may lie in less than all features of a single disclosed embodiment. Thus, the claims following the Detailed Description are hereby expressly incorporated into this Detailed Description, with each claim standing on its own as a separate embodiment of the invention.

What is claimed is:

1. A method comprising:
   accessing a workpiece object, the workpiece object including a mechanical support substrate, a release layer over the mechanical support substrate, and an integrated circuit substrate coupled over the release layer, the integrated circuit substrate including a device layer having semiconductor devices;
   etching through-substrate via (TSV) openings through the integrated circuit substrate that have buried ends at or within the release layer including using the release layer as an etch stop;
   forming TSVs by introducing one or more conductive materials into the TSV openings;
   etching a die singulation trench at least substantially through the integrated circuit substrate around a perimeter of an integrated circuit die; and
   at least substantially releasing the integrated circuit die from the mechanical support substrate.

2. The method of claim 1, wherein at least substantially releasing the integrated circuit die comprises etching the release layer between the integrated circuit die and the mechanical support substrate.

3. The method of claim 2, wherein etching the release layer comprises exposing a hermetic passivation and protection layer on the release layer.

4. The method of claim 2, wherein etching the release layer comprises providing access by an etchant to the release layer through a plurality of openings defined through the mechanical support substrate.

5. The method of claim 1, wherein etching the TSV openings comprises etching TSV openings that have a diameter of less than 1 μm through a thickness of the integrated circuit substrate that is no more than 25 μm.

6. The method of claim 5, wherein etching the TSV openings comprises etching TSV openings that have a diameter ranging from 0.1 μm to 0.8 μm and a pitch that ranges from 1 μm to 8 μm through a thickness of the integrated circuit substrate that is no more than 25 μm.

7. The method of claim 1, wherein etching the die singulation trench comprises etching the die singulation trench with at least one of a reactive ion etch and a deep reactive ion etch.

8. The method of claim 1, wherein etching the TSV openings comprises etching the TSV openings with at least one of a reactive ion etch and a deep reactive ion etch.

9. The method of claim 1, wherein etching the die singulation trench comprises etching the die singulation trench in a shape selected from a triangular shape, a pentagonal shape, a hexagonal shape, an octagonal shape, a circular shape, an oval shape, a semi-circular shape, and an irregular shape.

10. The method of claim 1, further comprising:
separating the integrated circuit die from the mechanical support substrate;
stacking the integrated circuit die vertically relative to a second integrated circuit die; and
electrically coupling the TSVs of the integrated circuit die with interconnects of the second integrated circuit die.

11. The method of claim 10, wherein separating the integrated circuit die from the mechanical support substrate comprises breaking an anchor used to couple the integrated circuit die with the mechanical support substrate.

12. The method of claim 10, wherein separating the integrated circuit die from the mechanical support substrate comprises:
contacting a receiving substrate with a plurality of integrated circuit die including the integrated circuit die; and
separating the receiving substrate and the plurality of integrated circuit die from the mechanical support substrate.

13. The method of claim 1, further comprising, prior to accessing the workpiece object:
coupling the integrated circuit substrate over the release layer, wherein a thickness of the integrated circuit substrate is no more than 25 µm.

14. The method of claim 1, further comprising:
separating the integrated circuit die from the mechanical support substrate; and
forming a layer over the mechanical support substrate.

* * * * *